(12) United States Patent
Park et al.

(10) Patent No.: US 8,373,234 B2
(45) Date of Patent: Feb. 12, 2013

(54) SEMICONDUCTOR DEVICE AND METHOD FOR FORMING THE SAME

(75) Inventors: Jeong Hoon Park, Gyeonggi-do (KR); Dong Sauk Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 305 days.

(21) Appl. No.: 12/649,637

(22) Filed: Dec. 30, 2009

(65) Prior Publication Data

US 2011/0133283 A1 Jun. 9, 2011

(30) Foreign Application Priority Data

Dec. 9, 2009 (KR) .......................... 10-2009-0121764

(51) Int. Cl.
*H01L 21/70* (2006.01)

(52) U.S. Cl. ................ 257/368; 257/408; 257/E27.014; 257/E21.66; 438/197

(58) Field of Classification Search .................. 438/197; 257/368, 408, 730, E27.014, E21.616, E21.66
See application file for complete search history.

(56) References Cited

U.S. PATENT DOCUMENTS

| | | | | |
|---|---|---|---|---|
| 5,406,102 A * | 4/1995 | Oashi | ............................ | 257/296 |
| 6,403,435 B1 * | 6/2002 | Kang et al. | .................... | 438/311 |
| 2004/0188802 A1 * | 9/2004 | Babcock et al. | .............. | 257/565 |
| 2006/0038261 A1 * | 2/2006 | Gong et al. | .................... | 257/622 |
| 2006/0141691 A1 * | 6/2006 | Kim | ............................. | 438/199 |
| 2006/0292793 A1 * | 12/2006 | Sandhu et al. | ................ | 438/257 |
| 2008/0038899 A1 * | 2/2008 | Ahn | ............................. | 438/430 |
| 2008/0070394 A1 * | 3/2008 | Uchiyama | .................... | 438/586 |
| 2008/0079071 A1 * | 4/2008 | Kim | ............................. | 257/334 |
| 2010/0171174 A1 * | 7/2010 | Matsuura et al. | ............. | 257/334 |

FOREIGN PATENT DOCUMENTS

| | | |
|---|---|---|
| JP | 2000-269424 A | 9/2000 |
| KR | 1020020055105 A | 7/2002 |
| KR | 1020060008593 A | 1/2006 |
| KR | 1020080006329 A | 1/2008 |

* cited by examiner

*Primary Examiner* — Matthew Landau
*Assistant Examiner* — Colleen E Snow
(74) *Attorney, Agent, or Firm* — Ladas & Parry LLP

(57) ABSTRACT

A semiconductor device includes a structure in which a difference in height between a cell region and a peripheral region are formed so that a buried gate structure of the cell region is substantially equal in height to the gate of the peripheral region, whereby a bit line and a storage node contact can be more easily formed in the cell region and parasitic capacitance can be decreased. The semiconductor device includes a cell region including a gate buried in a substrate, and a peripheral region adjacent to the cell region, where a step height between a surface of the cell and a surface of the peripheral region is generated.

31 Claims, 12 Drawing Sheets

| CELL REGION | PERIPHERAL REGION |

SEMICONDUCTOR DEVICE AND METHOD FOR FORMING THE SAME

CROSS-REFERENCE TO RELATED APPLICATION

The priority of Korean patent application No. 10-2009-0121764 filed on Dec. 9, 2009, the disclosure of which is hereby incorporated in its entirety by reference, is claimed.

BACKGROUND OF THE INVENTION

Embodiments of the present invention relate to a semiconductor device and a method for forming the same, and more particularly to a semiconductor device including a buried gate and a method for forming the same.

A Dynamic Random Access Memory (DRAM) includes a plurality of unit cells, each of which includes a capacitor and a transistor. The capacitor is used to temporarily store data therein. The transistor is used to transmit data from a bit line to a capacitor in correspondence with a control signal (e.g., a control signal applied to a word line) using the electric conductivity of a semiconductor device that changes depending on environment. The transistor has three regions including a gate, a source and a drain, where charges between the source and the drain move in response to a control signal applied to the gate. The charges between the source and the drain move through a channel region in accordance with the properties and operation of the semiconductor device.

When a general transistor is formed in a semiconductor substrate, a gate is formed on the semiconductor substrate, and the semiconductor substrate is doped with impurities at both sides of the gate to form a source and a drain. In this case, the region under the gate between the source and the drain acts as a channel region of the transistor. Thus, is such a case the channel region extends horizontally, and a transistor including the horizontal channel region occupies a predetermined area of a semiconductor substrate. Reducing the overall area of a complicated semiconductor memory apparatus is difficult due to the large number of transistors with horizontal channel regions that are contained in the semiconductor device.

In the manufacturing process of a semiconductor memory device, a wafer is provided on which a plural number of the semiconductor devices are formed. If the overall area of the semiconductor memory device is reduced, the number of semiconductor memory devices capable of being acquired from each wafer is increased, resulting in increased productivity. A variety of methods have been proposed to reduce the overall area of the semiconductor memory device. A representative method uses a recess gate wherein a recess is formed in a substrate and a gate is formed in the recess such that a curved channel region extends along the outer surfaces of the recess, instead of using a conventional planar gate having a horizontal channel region. Another representative method is burying the entirety of the gate in the recess to form a buried gate.

In the case of the buried gate structure, the entire gate is buried under the surface of the semiconductor substrate, so that a channel length and width can be guaranteed. With such a structure, parasitic capacitance between a gate (word line) and a bit line can be decreased by about 50% as compared to the conventional planar gate.

However, from the viewpoint of the entire structure which includes both a cell region and a peripheral region, when implementing the buried gate structure, there is a difference in height between the buried gate of the cell region a gate formed in the peripheral region; and therefore, a method for compensating for the space caused by the difference in height is necessary. A variety of methods have been considered, for example, i) one method in which a cell region space as high as the gate of the peripheral region remains empty or unused, and ii) another method in which the bit lines of the cell region are formed simultaneously with the process of forming the gate of the peripheral area.

However, the above-mentioned method (i), in which empty/unused space is provided for the cell region, has a disadvantage in that a storage node contact should be formed at a deeper depth when the height of the storage node contact plug is increased, resulting in an increased degree of difficulty in forming a bit line. The above-mentioned method (ii) for simultaneously forming the gate of the peripheral region and the gate of the cell region has a disadvantage in that an electrode of the cell region bit line and the gate electrode of the peripheral region are formed by the same material since they are formed through the same process, and thus a barrier metal layer is also formed, and consequently the gate of the peripheral region becomes higher. As a result, parasitic capacitance of the cell region increases which is contrary to the goal behind formation of the buried gate.

BRIEF SUMMARY OF THE INVENTION

Various embodiments of the present invention include a semiconductor device and a method for fabricating the same that substantially obviate one or more problems caused by the limitations and disadvantages of the related art.

In an embodiment of the present invention a semiconductor device and a method for forming the same having a difference in height between a cell region and a peripheral region is accomplished so that a buried gate of the cell region is equal in height to the gate of the peripheral region. With such a structure, a bit line and a storage node contact can be easily formed in the cell region and parasitic capacitance can be decreased.

In accordance with an embodiment of the present invention, a semiconductor device includes a cell region formed with a gate buried in a substrate, and a peripheral region formed to be adjacent to the cell region, wherein a step height between a surface of the cell and a surface of the peripheral region is generated. As a result, the buried gate structure of the cell region can be formed to be substantially equal in height to the gate of the peripheral region.

The surface of the peripheral region may be formed at a position lower than that of a substrate surface of the cell region.

The semiconductor device may further include a hard mask or a landing plug formed on the substrate of the cell region, whereby a difference in thickness between the hard mask and the landing plug is formed between the cell region and the peripheral region.

The semiconductor device may further include a hard mask layer formed on the substrate of the cell region. The hard mask layer may include any one of an oxide material, a nitride material, or a stacked structure of the oxide and nitride materials. As a result, the hard mask layer serves as an etch mask for the peripheral region.

The semiconductor device may further include a landing plug located at a lower part of the hard mask layer in an active region of the cell region. As a result, the bit line contact hole and the storage contact hole can be easily etched.

The semiconductor device may further include a device isolation layer that is etched to a predetermined thickness in a substrate of each of the cell and peripheral regions, wherein the device isolation layer of the peripheral region is deeper than that of the cell region. Active regions can be easily isolated from each other by the device isolation layer, irrespective of the step height between the cell region and the peripheral region.

The semiconductor device may further include a bit line that is located at the same height on a gate of the cell region and a gate of the peripheral region, so that parasitic capacitance can be decreased.

The semiconductor device may further include a gate that that is formed in the peripheral region and includes a polysilicon layer, a gate metal layer, and a gate hard mask layer, wherein the gate hard mask layer includes any one of structures (i), (ii), (iii) and (iv), in that a nitride layer is deposited and Chemical Mechanical Polishing (CMP)-processed in the structure (i); a nitride layer and an amorphous carbon layer are sequentially deposited in the structure (ii); a nitride layer and an oxide layer are sequentially deposited and CMP-processed in the structure (iii); and a nitride layer and an oxide layer are sequentially deposited and CMP-processed and the resultant nitride layer is wet-etched in the structure (iv).

The semiconductor device may further include a Lightly Doped Drain (LDD) region that is formed in a semiconductor substrate adjacent to the gate of the peripheral region, and includes a low-density source drain ion implantation region and a high-density source drain ion implantation region, so that the SCE or hot carrier problems can be relieved.

In accordance with another embodiment of the present invention, a method for forming a semiconductor device includes forming a step height between a surface of a peripheral region and a surface of a cell region, and burying a gate in a substrate of the cell region. As a result, the buried gate of the cell region is equal in height to the gate of the peripheral region.

The forming of the step height may include etching a substrate of the peripheral region to a predetermined depth in such a manner that the substrate of the peripheral region is formed at a position lower than that of the substrate of the cell region.

The forming of the step height may include depositing a hard mask layer, a landing plug, or a stacked structure of the hard mask and the landing plug on a surface of the substrate of the cell region.

The hard mask layer may include any one of an oxide material, a nitride material, or a stacked structure of the oxide and nitride materials. The method may further include, prior to the forming of the hard mask layer, forming the landing plug at an upper part of on the substrate of the cell region. As a result, the bit line contact hole and the storage contact hole can be easily etched.

The method may further include, prior to the forming of the step height, forming a device isolation layer in each substrate of the cell region and the peripheral region.

The forming of the device isolation layer may include etching the device isolation layer of the peripheral region more deeply than the other device isolation layer of the cell region.

The forming of the device isolation layer may include etching a semiconductor substrate using a dry etching process based on $C_xH_yF_z$ material, and thus forming a trench.

The method may further include, after the forming of the trench, forming a wall oxide layer and a liner nitride layer on a surface of the trench, and forming an insulating layer, that is Spin On Coating (SOC)-processed and annealed, or is High Density Plasma Chemical Vapor Deposition (HDPCVD)-processed, and planarizing an upper part of the insulating layer using a Chemical Mechanical Polishing (CMP) process. As a result, the device isolation layer can be easily formed.

The method may further include, after the forming of the device isolation layer, forming an N-type well and a P-type well by implanting ions in a semiconductor substrate including the cell region and the peripheral region.

The method may further include, after the forming of the step height, annealing a surface of the device isolation layer.

The annealing of the surface of the device isolation layer is carried out under a wet, dry or radical environment.

The method may further include forming a bit line to be located at the same height on a gate of the cell region and a gate of the peripheral region.

The method may further include, before or after the burying of the gate in the substrate of the cell region, forming a gate in the substrate of the peripheral region.

The forming of the gate in the substrate of the peripheral region may include forming a polysilicon layer, a gate metal layer, and a gate hard mask layer in a substrate, and etching the gate hard mask layer, the gate metal layer, and the polysilicon layer.

The method may further include, after the etching of the gate hard mask layer, the gate metal layer, and the polysilicon layer, implanting low-density source drain ions into the semiconductor substrate, forming a spacer at sidewalls of the gate structure, and implanting high-density source drain ions into the semiconductor substrate. As a result, the SCE or hot carrier problems can be relieved.

The method may further include, after the forming of the gate hard mask layer, the gate metal layer, and the polysilicon layer in the substrate, etching and removing a polysilicon layer of the cell region, etching and removing a polysilicon layer located at a boundary between the cell region and the peripheral region.

The forming of the gate hard mask layer includes any one of operations (i), (ii), (iii) and (iv), wherein a nitride layer is deposited and Chemical Mechanical Polishing (CMP)-processed in the operation (i); a nitride layer and an amorphous carbon layer are sequentially deposited in the operation (ii); a nitride layer and an oxide layer are sequentially deposited and CMP-processed in the operation (iii); and a nitride layer and an oxide layer are sequentially deposited and CMP-processed and the resultant nitride layer is wet-etched in the operation (iv).

The method may further include depositing a nitride layer not only at a cell region having no polysilicon layer but also at a boundary between the cell region and the peripheral region.

The method may further include, after the depositing of the nitride layer, burying a gate in the cell area.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts. A semiconductor device and a method for fabricating the same according to embodiments of the present invention will hereinafter be described with reference to the appended drawings.

FIGS. 1A to 1J are cross-sectional views showing a semiconductor device according to an embodiment of the present invention.

Figure 1A:
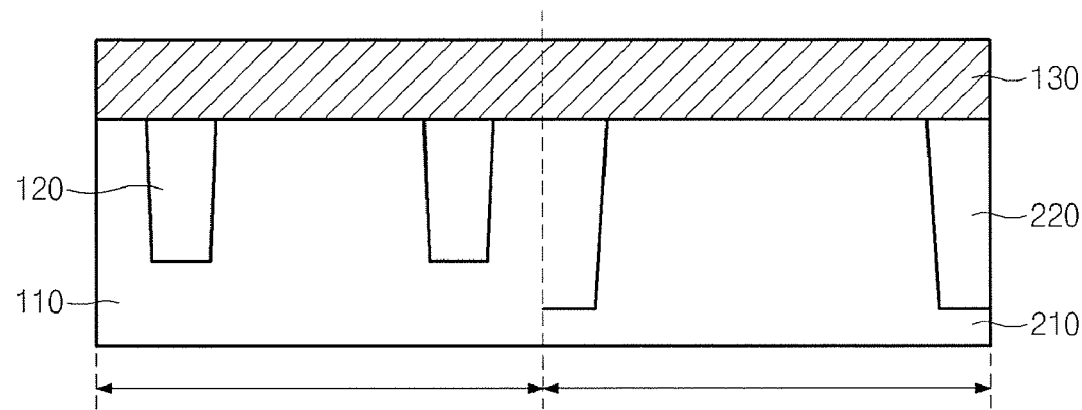
FIGS. 1A to 1J are cross-sectional views showing a semiconductor device according to an embodiment of the present invention.

Referring to FIG. 1A, device isolation layers 120 and 220 for respectively defining active regions 110 and 210 are formed in a semiconductor substrate including a cell region and a peripheral region. In an embodiment, the process for forming the device isolation layers 120 and 220 may include a Shallow Trench Isolation (STI) process for forming a trench having a predetermined depth in the substrate and depositing a material for forming the device isolation layer in the trench. In this case, a hard mask having a stacked structure may be used, in which an oxide layer for opening/exposing the formation area of the device isolation layer 120 or 220 and a nitride layer are deposited, or another hard mask structure, for example a hard mask formed of an amorphous carbon layer, may be used. In addition, dry etching, for example, may also be used in the process for etching the trench.

A difference in height between the cell region and the peripheral region occurs according to the following embodiment of the present invention. Therefore, it is preferable that the device isolation layer 220 of the peripheral region be deeper than the device isolation layer 120 of the cell region due to the difference in height. For these purposes, an etching gas ($C_xH_yF_z$) generating large amounts of polymer by-products is used in the process for etching the trench where the device isolation layer 120 or 220 is to be formed.

In an embodiment, a wall oxide layer (wall Ox: not shown) and a liner nitride layer (not shown) are sequentially formed on the surface of the above-mentioned trench. In an embodiment, the insulating layer used for forming the device isolation layer 120 or 220 is SOC (Spin On Coating)—processed and annealed or is HDPCVD (High Density Plasma Chemical Vapor Deposition)-processed. After that, an upper part of the insulating layer is planarized by a Chemical Mechanical Polishing (CMP) process, so that the device isolation layers 120 and 220 shown in FIG. 1 can be formed.

Figure 1B:
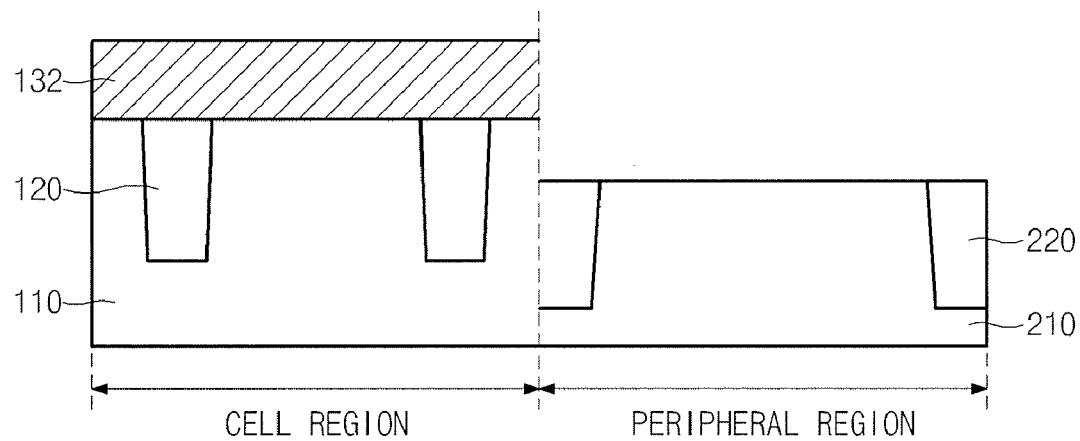

Thereafter, ions are implanted in the semiconductor substrate including the cell region and the peripheral region so that an N-type well and a P-type well are formed (not shown). Needless to say, the process for forming the N-type well and the P-type well may also be carried out after generation of the step height of the circuit part which is described below and is shown in FIG. 1B. In the present invention, a step height between a surface of one region and a surface of another region is where the height of the surface of one region is greater than the height of the surface in the other region, so as to form a step.

Referring to FIG. 1A, a hard mask layer 130 is deposited on the semiconductor substrate including the device isolation layers 120 and 220. The hard mask layer 130 may be formed of an oxide layer or a nitride layer, or be formed of a stacked structure including the oxide layer and the nitride layer, and it is preferable that the hard mask layer 130 have a thickness of approximately 1000 Å.

Referring to FIG. 1B, the peripheral region of the hard mask layer 130 is etched so as to leave a hard mask pattern 132 which an opening over the peripheral region. The semiconductor substrate of the peripheral area is etched using the hard mask pattern 132 as a mask, so that there arises a difference in height between the cell region and the peripheral region. In an embodiment, a silicon material (active region 210) and an oxide material (device isolation layer 220) are simultaneously etched when the semiconductor substrate of the peripheral region is etched. Therefore, it is preferable that an etching material having substantially no etch selection ratio between the silicon and the oxide material be used. Although the area exposing the device isolation layer 220 is annealed, the annealed result is not satisfactory to make an elaborate or dense structure, since the surface of the annealed area remains soft. As a result, it is preferable that an additional annealing process for densifying such a soft structure be carried out. In this case, the annealing process may be carried out under various environments such as wet, dry, and radical environments.

In other words, in an embodiment, a hard mask is formed in the cell region, and the substrate of the peripheral region is etched using the hard mask so as to form a step height between the cell region and the peripheral region.

Figure 1C:
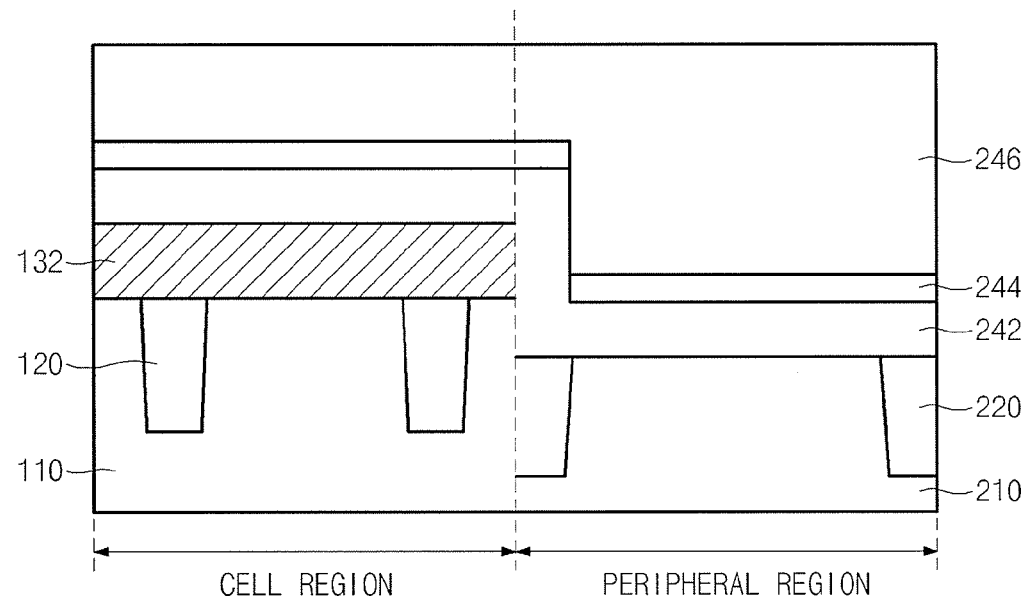

Referring to FIG. 1C, a polysilicon layer 242, a gate metal layer 244, and a nitride layer 246 are sequentially deposited to form a gate of the peripheral region. In this case, it is preferable that a barrier metal layer (not shown) be formed under the gate metal layer 244. Exemplary methods for forming the nitride layer 246 used as a gate hard mask include the following methods (i) to (iv). In method (i), the nitride layer 246 is deposited and CMP-processed. In method (ii), the nitride layer and an amorphous carbon layer are sequentially deposited. In method (iii), the nitride layer and an oxide layer are sequentially deposited and CMP-processed. In method (iv), the nitride layer and the oxide layer are sequentially deposited and CMP-processed, and the resultant nitride layer is wet-etched or the like.

Figure 1D:
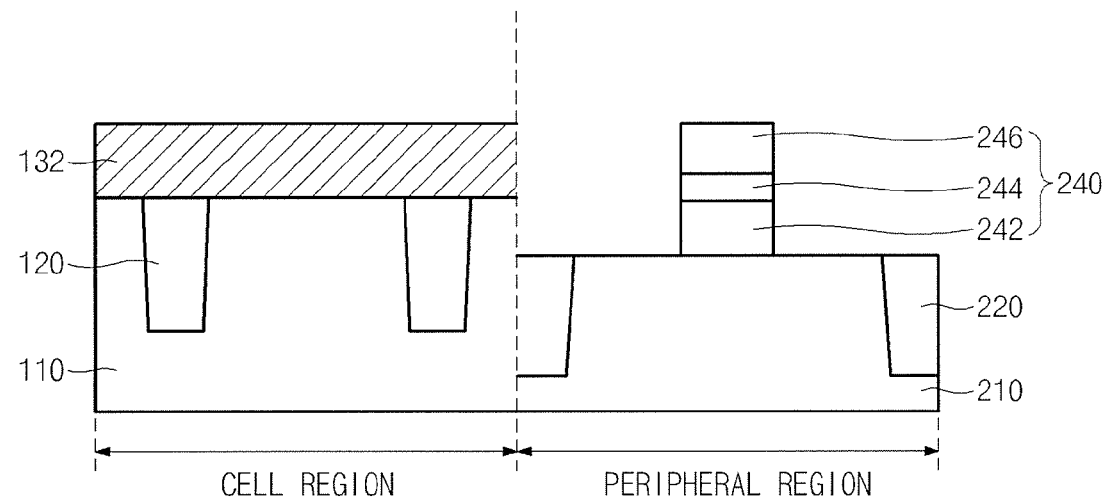

Referring to FIG. 1D, a mask (not shown) covering only the gate area of the peripheral region is formed; and the nitride layer 246, the gate metal layer 244, and the polysilicon 242 are sequentially etched using the mask, so that a gate structure 240 is formed.

Figure 1E:
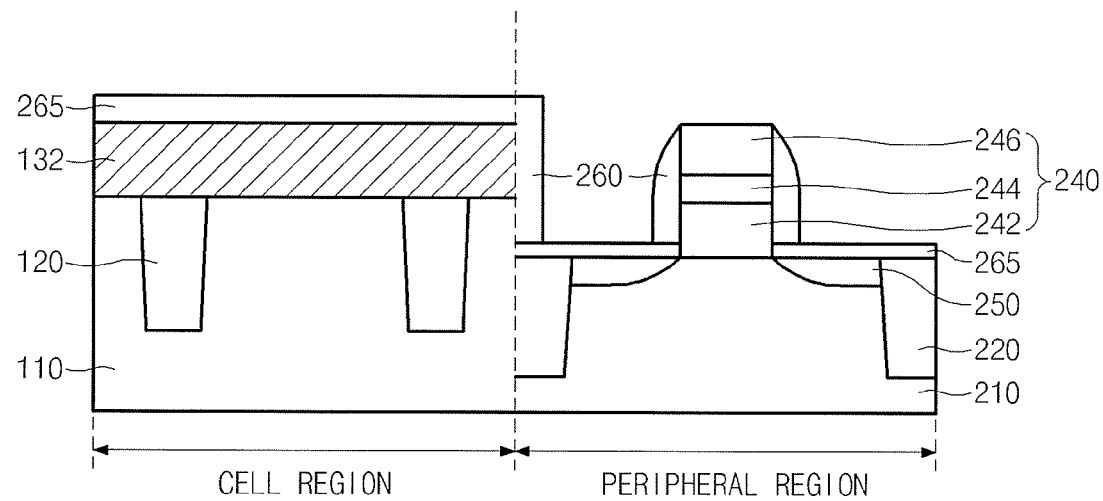

Referring to FIG. 1E, a Lightly Doped Drain (LDD) region is formed on the semiconductor substrate located laterally from the gate 240 of the peripheral region. In more detail, low-density source drain ions are implanted in the portion of the semiconductor substrate located to the side of the gate structure 240, and a spacer 260 formed of an oxide or nitride layer is formed on sidewalls of the gate structure 240. Thereafter, high-density source drain ions are implanted in the semiconductor substrate located laterally from the gate structure 240 in order to form the LDD region 250. The LDD region 250 can reduce Short Channel Effect (SCE) or hot carrier problems associated with a general source/drain structure. In addition, a thin nitride layer 265 is formed on the entire surface of the semiconductor substrate including the LDD region 250.

Figure 1F:
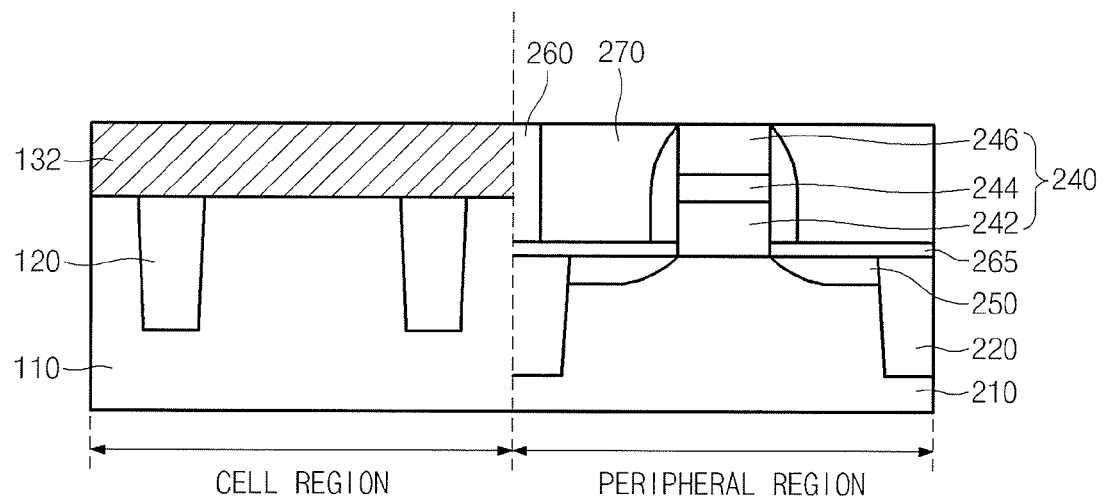

Referring to FIG. 1F, an interlayer insulating layer 270 is deposited over the entire surface of the peripheral region so that the empty space having no gate structure 240 is filled with the interlayer insulating layer 270. In this case, the interlayer insulating layer 270 may be formed of, for example, Boro-PhosphoSilicate Glass (BPSG), Spin On Dielectric (SOD) or High Density Plasma (HDP) material.

Figure 1G:
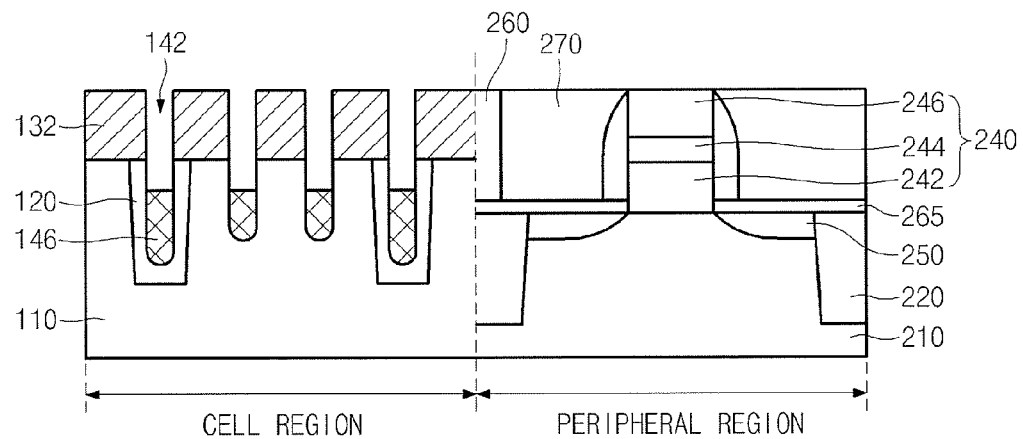
Figure 1H:
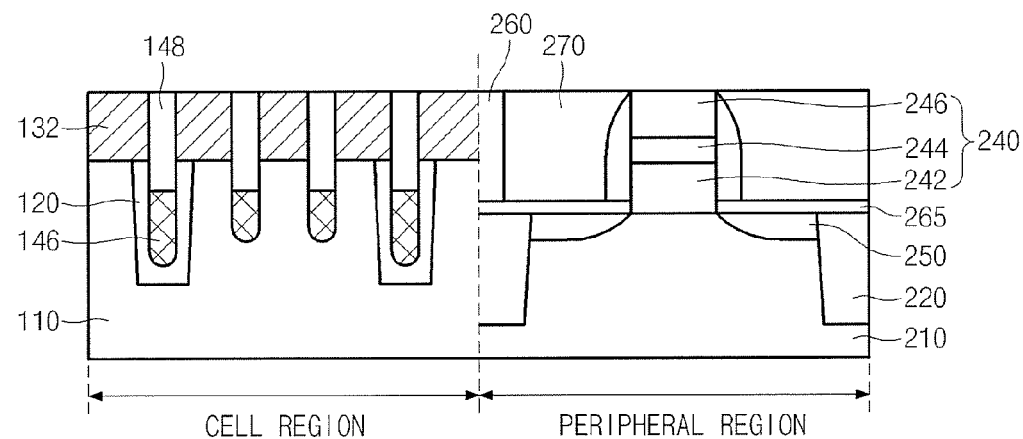

Referring to FIGS. 1G and 1H, a buried gate is formed in the cell region. Although in the exemplary embodiments described above with reference to FIGS. 1A-1H, it was described that the gate of the peripheral region is formed and then the gate of the cell region is formed, it should be understood that the gate of the cell region can be first formed and the gate of the peripheral region can then be formed as is shown in following embodiments described later. In this case, the semiconductor substrate may be formed as shown in FIG. 1B, a gate material of the peripheral region may be deposited as shown in FIG. 1C, and then the buried gate may be formed in the cell region.

Referring to FIG. 1G, under the condition that the gate structure 240 and the interlayer insulating layer 270 are formed in the peripheral region, a trench 142 for forming the buried gate of the cell region is formed. A gate oxide layer (not shown) may be formed on the surface of the trench 142. In an embodiment, the gate oxide layer is formed by a low-temperature plasma process, or is formed by a single-wafer-type radical oxidation process or dry oxidation process, so as to prevent deterioration of the characteristics elements contained in the peripheral region.

A gate metal layer 146 is formed at the bottom of the trench 142. In an embodiment, the gate metal layer 146 is formed by depositing a titanium nitride layer (TiN) or a tungsten nitride layer (WN) using, for example, a Chemical Vapor Deposition (CVD)- or Atomic Layer Deposition (ALD)-process, and is CMP-processed or etched back so that the gate metal layer 146 remains recessed under the upper surface of the active region 110.

Referring to FIG. 1H, a capping insulating layer 148 is formed on the gate metal layer 146 within the trench 142. The capping nitride layer 148 may be formed of a silicon oxide nitride (SiON) layer, a nitride layer, or a combination of a nitride layer and an oxide layer. When conducting a subsequent thermal process under an oxidative environment, the capping insulating layer 148 may prevent the gate metal layer 146 from being oxidized or degraded. Accordingly, a buried gate structure is formed, where the buried gate structure includes the hard mask patter 132, the trenches formed extending from an upper surface of the hard mask pattern to the substrate, the gate metal layer 146 formed in the trenches, and the capping insulation layer 148 filling the remainder of the trench. A step height is formed between the buried gate structure and the surface of the substrate on which the gate structure 240 of the peripheral region is formed.

Figure 1I:
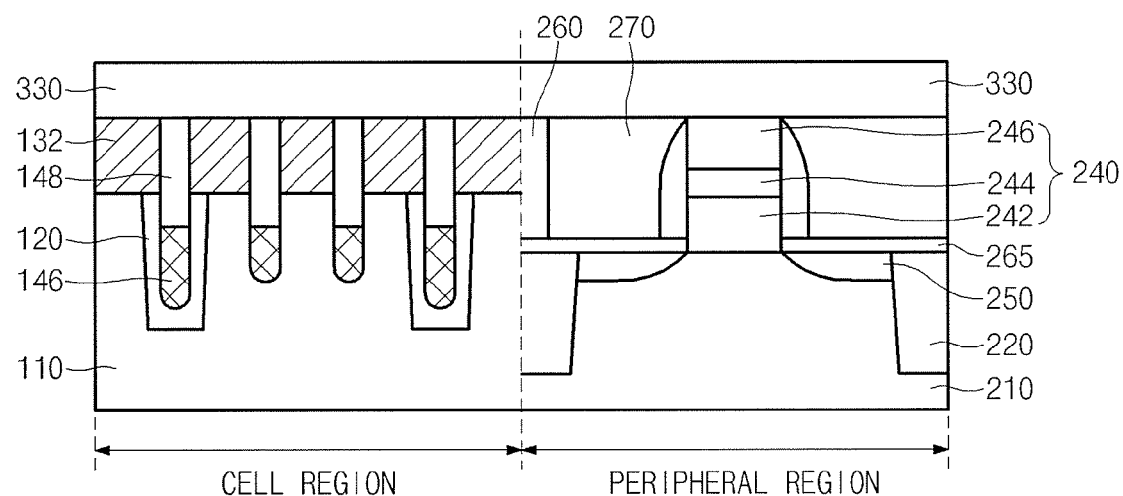
Figure 1J:
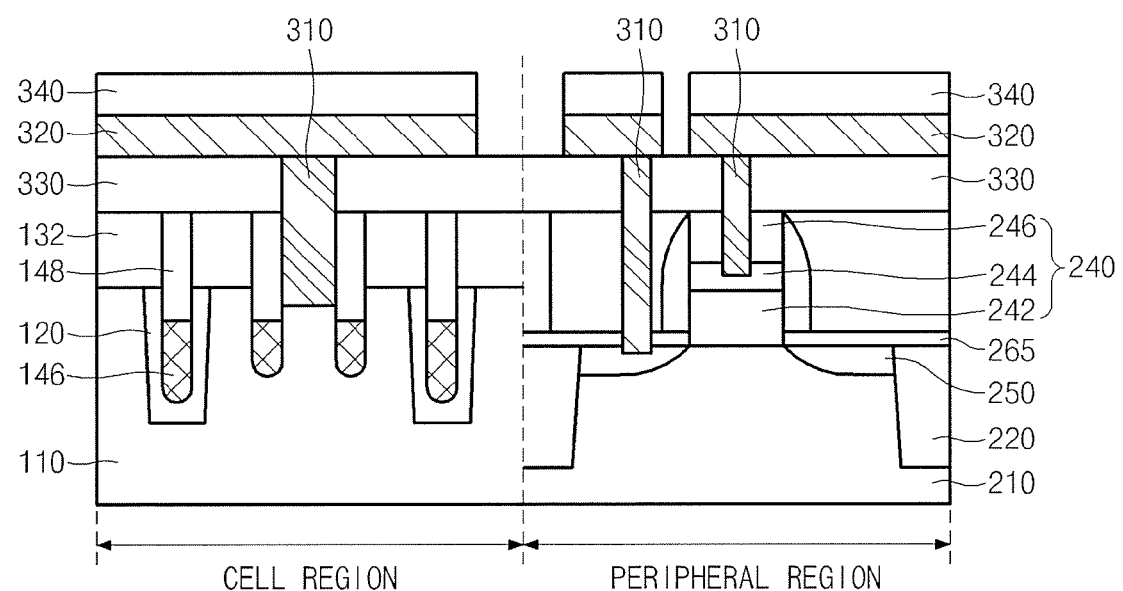

Referring to FIG. 1I, an interlayer insulating layer 330 is formed on both the cell region including the buried gate 146 and the peripheral region including the gate structure 240. Referring to FIG. 13, a bit line 320 for coupling to cells of the cell region and a bit line hard mask 340 are formed in each of the cell region and the peripheral region simultaneously so as to have substantially the same height in each of the regions (e.g., the upper surface of the bit line hard mask 340 is co-planar in the cell and peripheral regions). Prior to simultaneously forming the bit line 320 and the bit line hard mask 340, a bit line contact plug 310 is formed in both the cell region and the peripheral region. In an embodiment, the bit line contact plug 310 of the cell region may be formed of polysilicon, and the bit line contact plug 310 of the peripheral region may be formed of a metal layer or a stacked structure in which a polysilicon layer is deposited on the metal layer.

In an embodiment, the process for forming the bit line contact plug 310 of the cell region includes first forming a bit line contact hole extending from the upper surface of the interlayer insulating layer to and within, and then depositing a polysilicon layer over the entire surface thereof thereby filling the contact hole. An etch-back process is performed on the polysilicon layer formed on the interlayer insulating layer 330 and over contact hole so that the polysilicon layer remains only in the bit line contact hole, thus resulting in the bit line contact plug 310. Thereafter, a barrier metal layer and a tungsten material (W) used for constructing the bit line 320 are deposited and CMP-processed. The tungsten (W) material may be deposited by a CVD or a sputtering process so as to reduce the height of the bit line, resulting in a reduction of parasitic capacitance.

As can be seen from the above-mentioned first embodiment, a step height is formed in the cell region by etching the semiconductor substrate of the peripheral region. As a result, the buried gate structure of the cell region may have a height that is substantially the same or at least similar to the height of the gate structure of the peripheral region. Hence, the bit line of the cell region may be very similar in height to the bit line of the peripheral region, so that the bit line of the cell region and the storage node contact can be easily formed and parasitic capacitance can be reduced.

FIGS. 2A to 2L illustrate a semiconductor device and a method for forming the same according to another embodiment of the present invention. In embodiments shown with respect to FIGS. 2A to 2L, a landing plug is first formed in a substrate of the cell region, and a buried gate of the cell region is formed earlier than the peripheral region gate. In the drawings of the second embodiment, the same or similar elements as those of the first embodiment will be omitted for brevity.

Figure 2A:
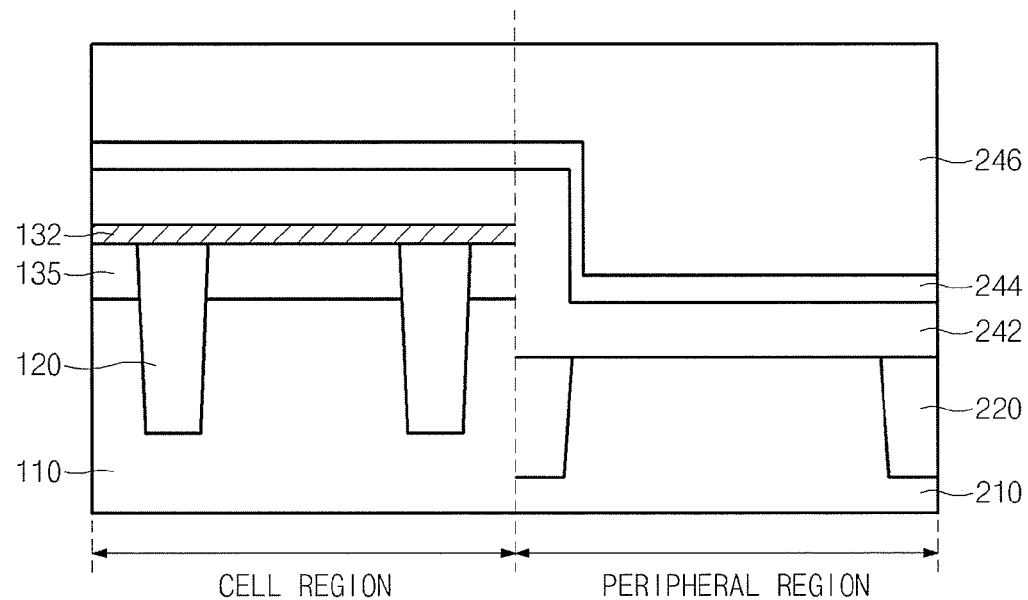
FIGS. 2A to 2L are cross-sectional views showing a semiconductor device according to an embodiment of the present invention.

Referring to FIG. 2A, a landing plug layer 135 is formed so as to be disposed on the semiconductor substrate 110, 210 in only the cell region. The landing plug layer 135 is a conductive layer used to form a bit line contact plug and a storage node contact plug, and in an embodiment the landing plug layer 135 includes a polysilicon material.

Thereafter, device isolation layers 120 and 220 for defining active regions 110 and 210 are formed in the semiconductor substrate. The process for forming the device isolation layers 120 and 220 may be conducted before the landing plug layer 135 is formed. However, in the case of forming the device isolation layer 120 or 220 after the landing plug layer 135 has been formed, the landing plug layer 135 should be separated to form a separated landing plug layer for each active region 110 or 210. In an embodiment, the depth of the device isolation layer 220 should be greater than the depth of the device isolation layer 120. The formation process of the device isolation layers 120 220 may be carried out in the same manner as in the first embodiment.

A hard mask 132 is formed on the landing plug layer 135 of the cell region, and the semiconductor substrate of the peripheral region is etched using the hard mask 132, so that a difference in height (i.e., step height) between the upper surface (e.g., active surface) of the cell region and the upper surface (e.g., active surface) of the peripheral region occurs. In the case of forming the substrate and the device isolation layers 220 in the peripheral region may be etched in the same manner described above with reference to FIG. 10.

Subsequently, a polysilicon layer 242, a gate metal layer 244, and a nitride layer 246 are sequentially deposited in order to form a gate of the peripheral region. In an embodiment, a barrier metal layer (not shown) is formed under the gate metal layer 244. The nitride layer 246 shown may be formed by the following exemplary methods (i) to (iv) in the same manner as the nitride layer 246 described above with reference to FIG. 1. In method (i), the nitride layer 246 is deposited and CMP-processed. In method (ii), the nitride layer and an amorphous carbon layer are sequentially deposited. In method (iii), the nitride layer and the oxide layer are sequentially deposited and CMP-processed. In method (iv), the nitride layer and the oxide layer are sequentially deposited and CMP-processed, and the resultant nitride layer is wet-etched or the like.

Figure 2B:
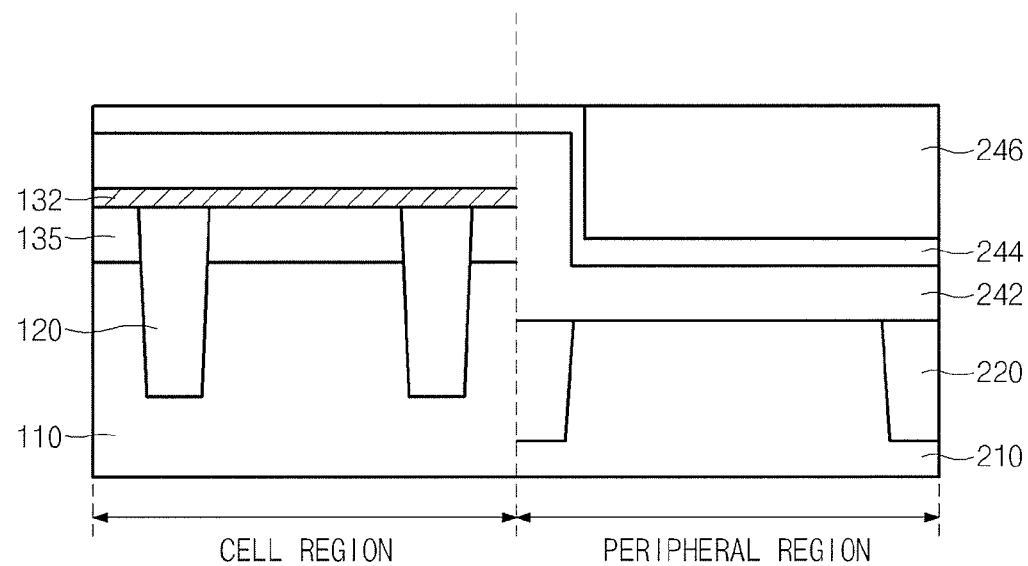
Figure 2C:
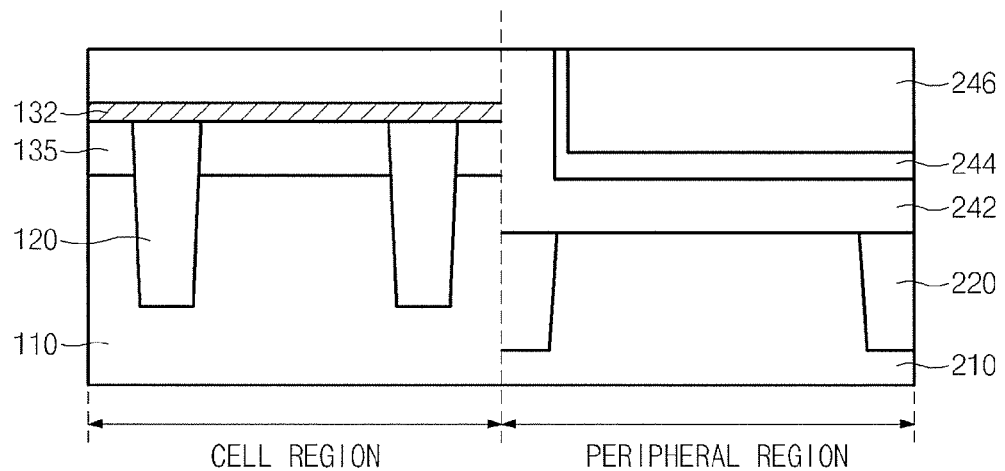

Referring to FIG. 2B, the upper part of the nitride layer 246 is removed and planarized by, for example, a CMP or etch-back process using the gate metal layer 244 of the cell region as an etch stop layer. After that, as shown in FIG. 2C, the gate metal layer 244 formed in the cell region is planarized or etched by, for example, a CMP process such that the gate metal layer 244 is removed. In this case, the gate metal layer 244 of the peripheral region which is positioned below where the gate metal layer was formed in the cell region remains, as shown in FIG. 2C.

Figure 2D:
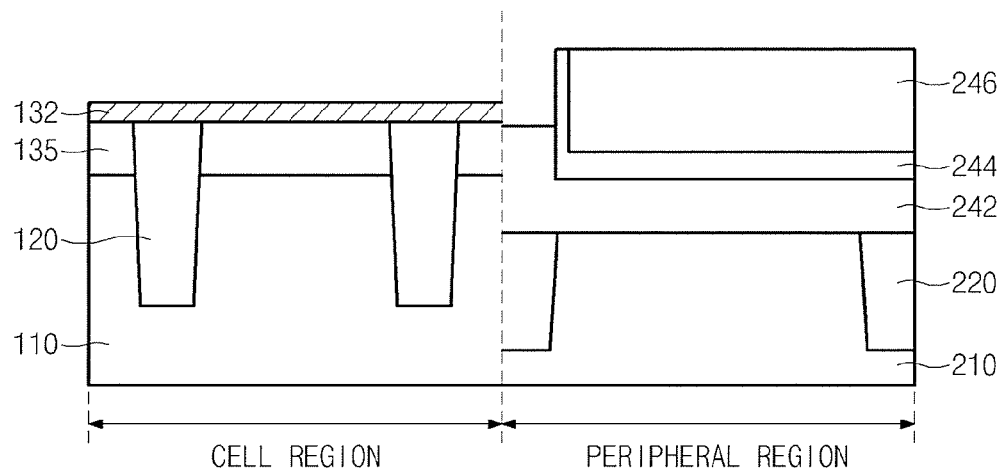

Referring to FIG. 2D, the polysilicon layer 242 formed on the hard mask layer 132 in the cell region is etched and removed. At the same time, a portion of the polysilicon layer 242 in the peripheral region is also etched and removed, where the portion of the removed polysilicon layer 242 in the peripheral region has an upper surface coinciding with the portion removed in the cell region.

Figure 2E:
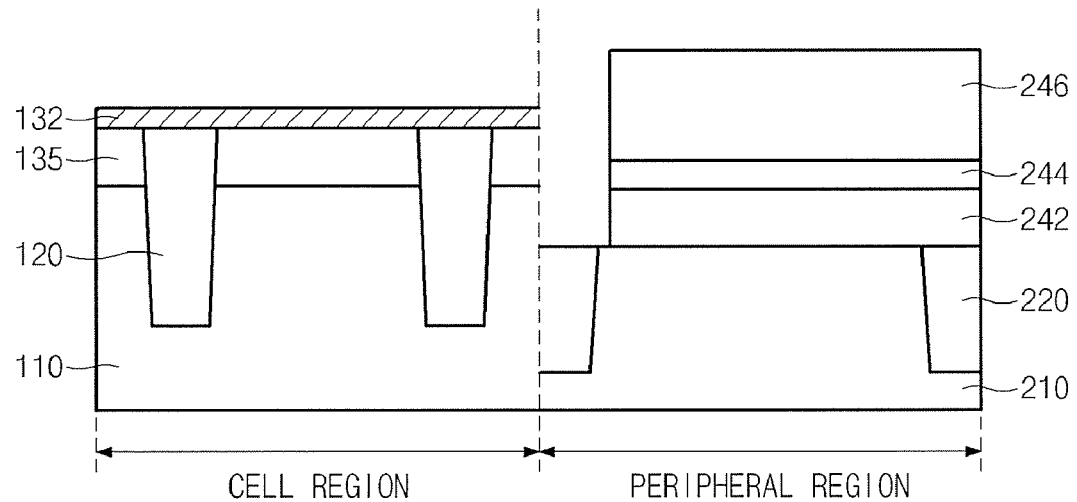
Figure 2F:
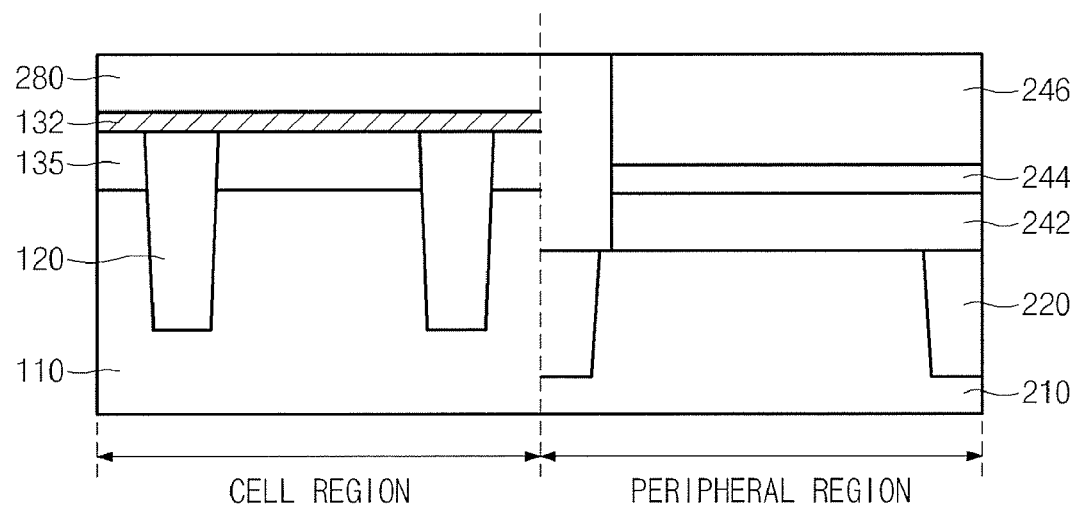

Referring to FIG. 2E, the polysilicon layer 242 and the gate metal layer 244 that are located at a boundary between the cell region and the peripheral region, are etched and removed. Referring to FIG. 2F, a nitride layer 280 is deposited over the semiconductor substrate at portions in the cell region and the peripheral region having no polysilicon layer 242. The above-mentioned process for removing the polysilicon layer 242 located at the boundary between the cell region and the peripheral region and forming the nitride layer 280 at the location where the polysilicon layer is removed allows the gate structure of the peripheral region to be easily patterned in the future, and increases the degree of insulation between the cell region and the peripheral region.

Figure 2G:
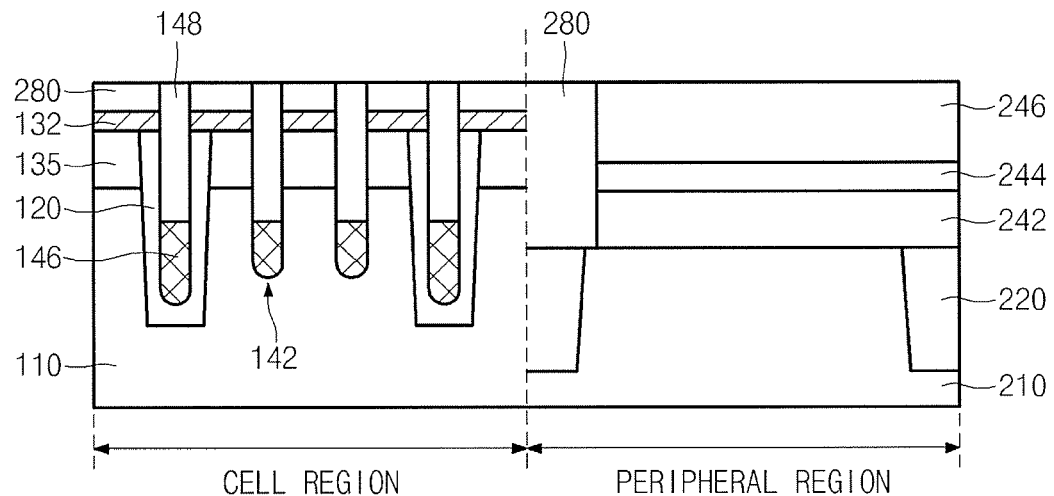

Referring to FIG. 2G, a plurality of buried gates are formed in the cell region. In more detail, a trench 142 having a predetermined depth is formed in a gate region of the cell region, a gate oxide layer is formed on the surface of the trench 142, and a gate metal layer 146 and a capping insulating layer 148 are formed in the trench 142. The material of the buried gates and their formation process may be the same as described above with reference to FIG. 1.

Figure 2H:
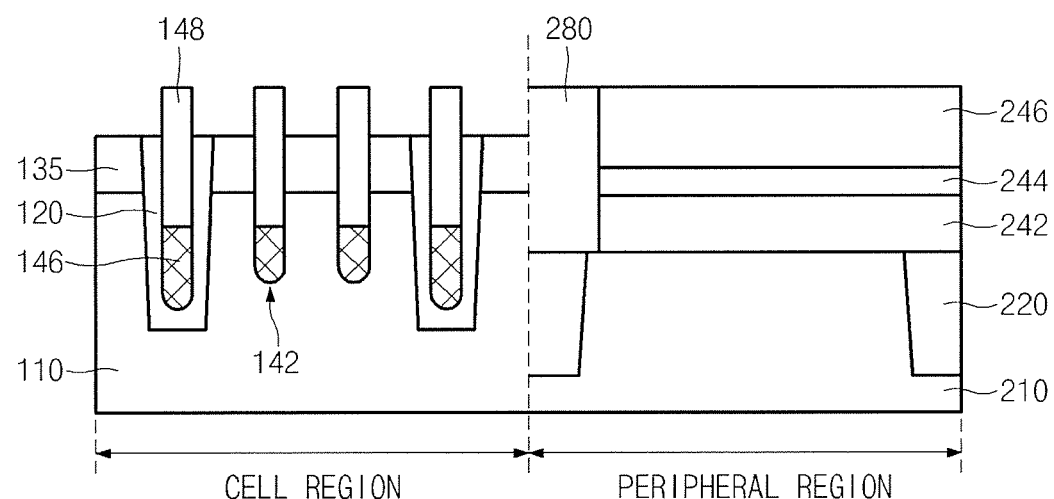

Referring to FIG. 2H, the nitride layer 280 and the hard mask layer 132 in the cell region are, for example, dry-etched or wet-etched so that they are removed from the cell region and the landing plug 135 is exposed. Meanwhile, in the case where an insulating layer, such as a pad oxide layer or a pad nitride layer, is formed at the upper or lower part of the landing plug 135, the landing plug layer 135 is not exposed, but is etched and removed together with the nitride layer 280 and the hard mask layer 132, and a landing plug material such as polysilicon is re-buried in the etched position. Also, the above-mentioned process for removing and re-burying the landing plug material may be carried out when the bit line contact hole and the storage node contact hole are etched in the future.

Figure 2I:
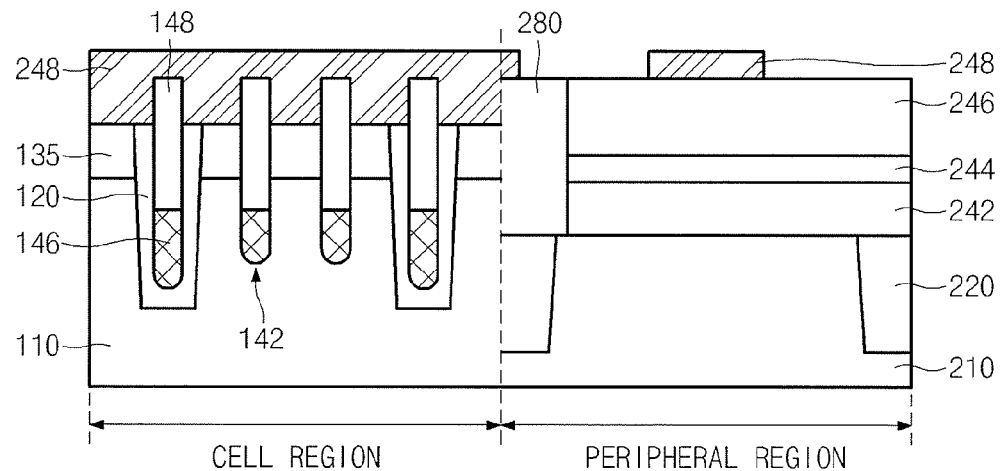

Referring to FIG. 2I, a mask pattern 248, that covers the entire surface in the cell region and a portion of the surface where the gate structure 240 (See FIG. 2J) is to be formed in the peripheral region, is formed on the semiconductor substrate having the buried gate. The mask pattern 248 may be, for example, a photoresist pattern or a hard mask pattern.

Figure 2J:
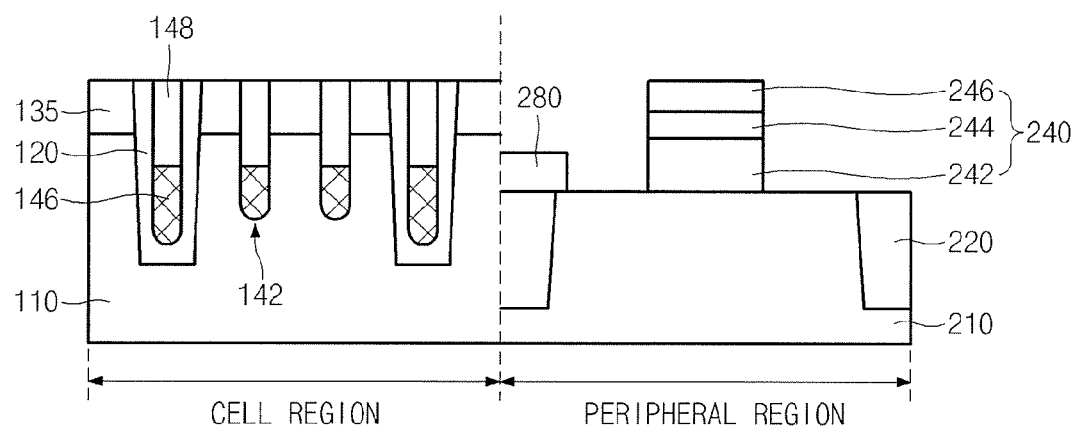

Referring to FIG. 2J, the nitride layer 246, the gate metal layer 244, and the polysilicon layer 242 are sequentially etched in the peripheral region using the mask pattern 248 as a mask, so that the gate structure 240 is formed in the peripheral region and the mask pattern 248 is removed. In this case, part of the nitride layer 280 may remain at the boundary between the cell region and the peripheral region. As described above, this boundary has no polysilicon layer serving as a conductive layer due to the presence of the nitride layer 280, so that the cell region and the peripheral region are isolated from each other.

Figure 2K:
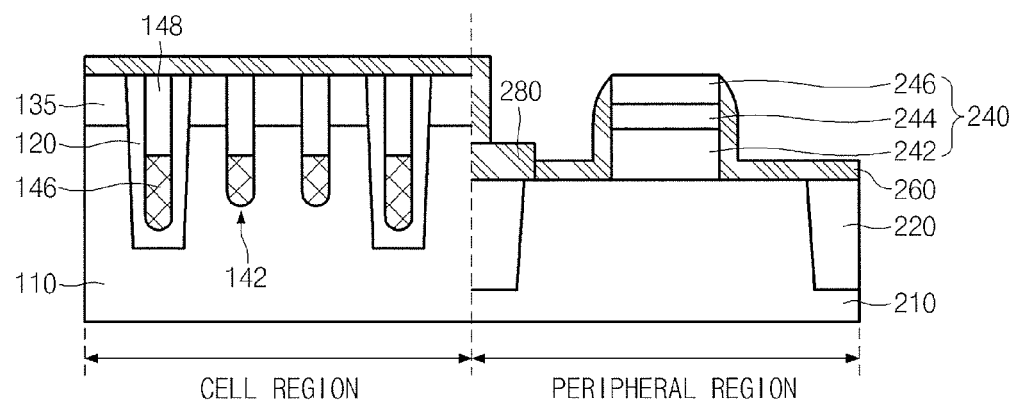

Referring to FIG. 2K, a spacer 260 formed of, for example, an oxide or nitride layer is formed to protect a side of the gate structure 240 in the peripheral region. In an embodiment, the LDD region 250 (See FIG. 1E) may be formed in the semiconductor substrate of the peripheral region adjacent to the gate structure 240. The LDD region 250 may be formed in the same manner as described above with reference to FIG. 1.

Figure 2L:
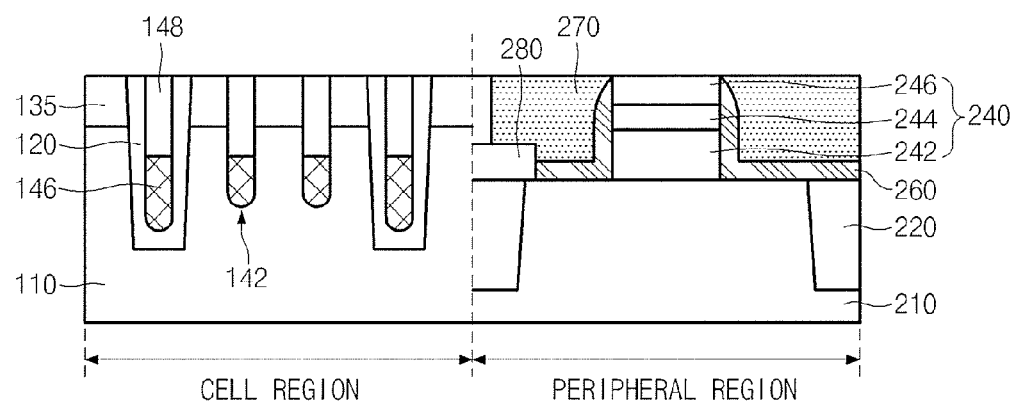

Referring to FIG. 2L, portions of the spacer layer 260 are removed, and an interlayer insulating layer 270 for filling the remaining space is formed in the peripheral region, and the cell region and the peripheral region are planarized by a predetermined process such as CMP. In this case, the interlayer insulating layer 270 may be formed of, for example, BoroPhosphoSilicate Glass (BPSG), Spin On Dielectric (SOD) or High Density Plasma (HDP) material.

Accordingly, for the embodiment described with reference to FIG. 2, a buried gate structure is formed, where the buried gate structure includes the landing plug layer 135, trenches formed extending from an upper surface of the landing plug layer to the substrate, the gate metal layer 146 formed in the trenches, and the capping insulation layer 148 filling the remainder of the trench. A step height is formed between the buried gate structure and the surface of the substrate on which the gate structure 240 of the peripheral region is formed.

Although for the embodiments described with reference to FIG. 2, it has been described that the gate of the cell region is formed and the gate of the peripheral region is then formed, it should be appreciated that the gate of the peripheral region can be formed first and the gate of the cell region can then be formed. In this case, under any one of the deposition conditions shown in FIGS. 2B to 2H, the gate material of the peripheral region may be patterned, and the gate of the peripheral region may be formed, and finally the buried gate may be formed in the cell region.

Thereafter, the process for forming the interlayer insulating layer, the bit line contact plug, and the bit line on both the cell region and the peripheral region may be the same as that described above with reference to FIG. 1. However, since the landing plug 135 is previously formed in the vicinity of the buried gate of the cell region, the contact hole need only to be etched as high as the landing plug 135 when the bit line contact plug or the storage node contact plug is formed. Therefore, an etching margin can be additionally guaranteed when the bit line contact hole or the storage node contact hole is formed.

The effect obtained in the first embodiment, in which the buried gate structure of the cell region and the gate structure of the peripheral region are formed to have the same height and the cell and peripheral regions have the same bit line height, so that a contact can be more easily formed and parasitic capacitance is reduced, can also be obtained in the second embodiment.

Figure 3A:
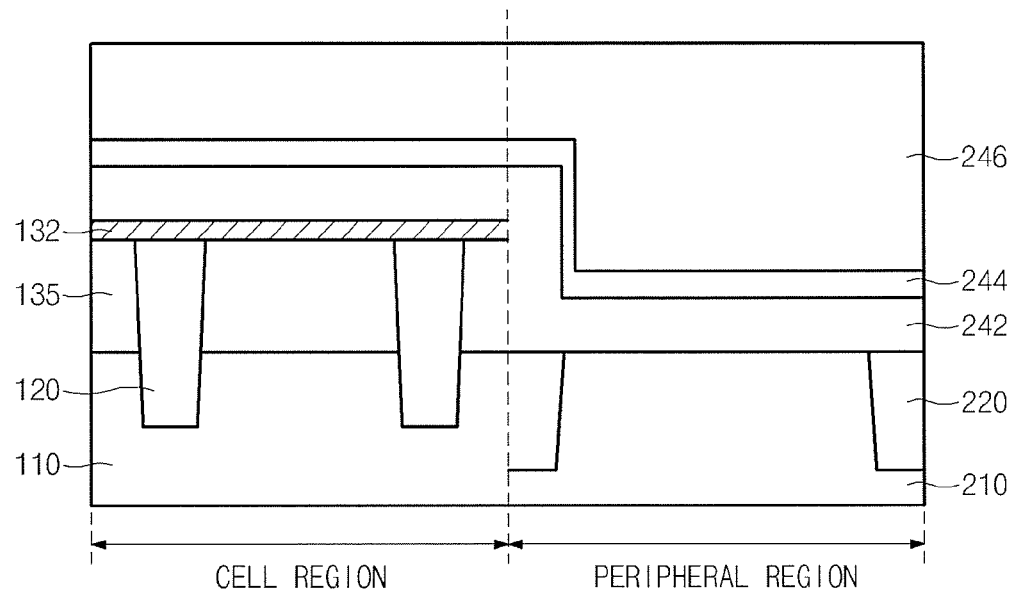
FIGS. 3A to 3B are cross-sectional views showing a semiconductor device according to another embodiment of the present invention.
Figure 3B:
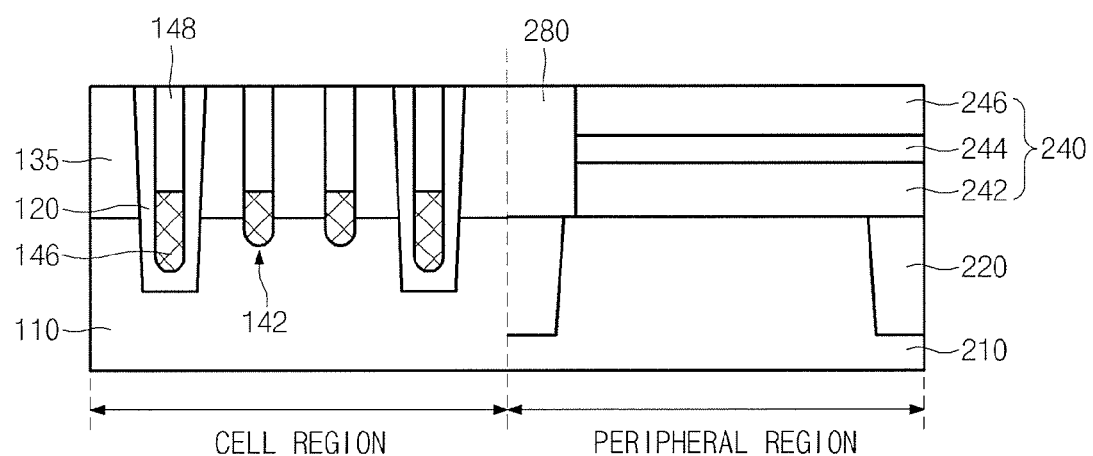

FIGS. 3A to 3B illustrate a semiconductor device and a method for forming the same according to another embodiment of the present invention. FIG. 3A corresponds to FIG. 2A, and FIG. 3B corresponds to FIG. 2L. In embodiments described with respect to claim 3, the substrate is not etched and instead a high landing plug is formed when a step height between the cell region and the peripheral region is formed. In FIGS. 3A-3B, the same or similar elements as those of the first or second embodiment will herein be omitted brevity.

Referring to FIG. 3A, a landing plug layer 135 is formed so as to be disposed only on the semiconductor substrate in the cell region. In the same manner as described above with reference to FIG. 2, the landing plug layer 135 is used as a conductive layer on which a bit line contact plug and a storage node contact plug are formed. In an embodiment, the landing plug layer 135 includes a polysilicon material.

The landing plug layer 135 shown in FIG. 3A is thicker than the landing plug layer 135 shown in FIG. 2A. In an embodiment, the landing plug layer 135 is formed to have the same or similar thickness as that of the buried gate of the cell region, and preferably, the landing plug 135 has a thickness of about 1000 Å. As a result, the above-mentioned third embodiment can further provide other effects in that the substrate of the peripheral region is not etched to obtain the difference in height between the cell region and the peripheral region, and thus the fabrication process of the semiconductor device can be simplified. Similar to the embodiments shown with respect to FIG. 2, a buried gate structure is formed, where the buried gate structure includes the landing plug layer 135, trenches formed extending from an upper surface of the landing plug layer to the substrate, the gate metal layer 146 formed in the trenches, and the capping insulation layer 148 filling the remainder of the trench.

The subsequent processes may be the same as those described above with reference to the embodiments of FIG. 1 or the embodiments of FIG. 2. As a result, as shown in FIG. 3B, the gate of the cell region may be very similar in height to the gate structure of the peripheral region. Hence, the bit line of the cell region may be substantially the same or at least very similar in height to the bit line of the peripheral region, so that the contact may be easily formed later and parasitic capacitance may also be reduced.

As apparent from the above description, the semiconductor device and the method for forming the same according to the above-mentioned embodiments of the present invention can allow the buried gate structure of the cell region to have the same height as that of the gate of the peripheral region, can easily form the bit line of the cell region and the storage node contact, and further reduce parasitic capacitance.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
   a cell region comprising a gate buried in a substrate;
   a cell region comprising a landing plug layer formed on the substrate;
   a peripheral region adjacent to the cell region, wherein a step height is formed between a surface of the cell region and a surface of the peripheral region,
   a groove having the buried gate formed therein is formed extending from the landing plug layer to the substrate in the cell region, and an upper end of the groove is positioned higher than the upper surface of the substrate in the peripheral region.

2. The semiconductor device according to claim 1, wherein the substrate is formed in the cell region and the peripheral region, and an upper surface of the substrate in the peripheral region is formed at a position lower that than of the upper surface of the substrate in the cell region.

3. The semiconductor device according to claim 1, further comprising one of a hard mask and a landing plug layer formed on the substrate of the cell region, wherein the substrate is formed in the cell region and the peripheral region and an upper surface of the one of the hard mask and the landing plug layer is formed at a position higher than the upper surface of the peripheral region.

4. The semiconductor device according to claim 1, wherein the substrate is formed in the cell region and the peripheral region, and the semiconductor device further comprises a hard mask layer formed on the substrate in the cell region, wherein a groove having the buried gate formed therein is formed extending from the hard mask layer to the substrate in the cell region, and an upper end of the groove is positioned higher than the upper surface of the substrate in the peripheral region.

5. The semiconductor device according to claim 4, wherein the hard mask layer includes any one of an oxide material, a nitride material, or a stacked structure of oxide and nitride materials.

6. The semiconductor device according to claim 1, wherein the substrate is formed in the cell region and the peripheral region, and the semiconductor device further comprises:
   a device isolation layer formed to a predetermined thickness in both the substrate in the cell region and in the substrate in the peripheral region,
   wherein the device isolation layer of the peripheral region is deeper than the device isolation layer of the cell region.

7. The semiconductor device according to claim 1, further comprising a bit line formed over the cell region and the peripheral region, wherein the distance from the bit line to a gate structure of the cell region is substantially the same as the distance from the bit line to a gate structure of the peripheral region.

8. The semiconductor device according to claim 1, wherein the substrate is formed in the cell region and the peripheral region, and the semiconductor device further comprises:
   a gate formed in the peripheral region on the semiconductor substrate, and the gate comprising a polysilicon layer, a gate metal layer, and a gate hard mask layer,
   wherein the gate hard mask layer includes any one or more of a nitride layer, an amorphous carbon layer, and an oxide layer.

9. The semiconductor device according to claim 8, further comprising:
   a Lightly Doped Drain (LDD) region formed in a semiconductor substrate adjacent to the gate of the peripheral region, the LDD region comprising a low-density source drain ion implantation region and a high-density source drain ion implantation region.

10. A method for forming a semiconductor device comprising:
    Forming a step height between a surface of a peripheral region and a surface of a cell region, wherein the step of forming the step height comprises: forming a landing plug layer on an upper surface of the substrate of the cell region; and
    burying a gate in a substrate of the cell region;
    after forming a landing plug layer on an upper surface of the substrate of the cell region, forming a hard mask layer on the landing plug layer.

11. The method according to claim 10, wherein the step of forming the step height comprises:
    etching a substrate of the peripheral region to a predetermined depth such that the substrate of the peripheral region is formed at a position lower than that of the substrate of the cell region.

12. The method according to claim 10, wherein the step of forming the step height comprises:
depositing a hard mask layer, a landing plug layer, or a stacked structure of the hard mask and the landing plug on a surface of the substrate of the cell region.

13. The method according to claim 12, wherein the hard mask layer includes any one of an oxide material, a nitride material, or a stacked structure of oxide and nitride materials.

14. The method according to claim 10, further comprising:
prior to the step of forming the step height, forming a device isolation layer in both the substrate of the cell region and a substrate of the peripheral region.

15. The method according to claim 14, wherein the device isolation layer of the peripheral region is formed deeper than the device isolation layer of the cell region.

16. The method according to claim 14, wherein the step of forming the device isolation layer comprises:
etching the semiconductor substrate using a dry etching process which utilizes $C_xH_yF_z$ to form a trench, and filling the trench with the device isolation layer.

17. The method according to claim 14, wherein the step of forming the device isolation layer comprises:
forming a trench in the substrate,
forming a wall oxide layer and a liner nitride layer on a surface of the trench;
forming an insulating layer, which is Spin On Coating (SOC)-processed and annealed, or is High Density Plasma Chemical Vapor Deposition (HDPCVD)-processed; and
planarizing an upper part of the insulating layer using a Chemical Mechanical Polishing (CMP) process.

18. The method according to claim 14, further comprising:
after the step of forming the device isolation layer, forming an N-type well and a P-type well by implanting ions in the substrate of the cell region and the substrate of the peripheral region.

19. The method according to claim 14, further comprising:
annealing a surface of the device isolation layer.

20. The method according to claim 19, wherein the step of annealing of surface of the device isolation layer is carried out under a wet, dry or radical environment.

21. The method according to claim 10, further comprising:
forming a bit line to be located at the same height on a gate of the cell region and a gate of the peripheral region.

22. The method according to claim 10, further comprising:
before or after the step of burying the gate in the substrate of the cell region,
forming a gate on a substrate of the peripheral region.

23. The method according to claim 22, wherein the step of forming the gate on the substrate of the peripheral region comprises:
forming a polysilicon layer, a gate metal layer, and a gate hard mask layer on the substrate; and
etching the gate hard mask layer, the gate metal layer, and the polysilicon layer.

24. The method according to claim 23, further comprising:
after the step of etching the gate hard mask layer, the gate metal layer, and the polysilicon layer,
implanting low-density source drain ions into the semiconductor substrate of the peripheral region;
forming a spacer on sidewalls of the gate structure; and
implanting high-density source drain ions into the semiconductor substrate of the peripheral region.

25. The method according to claim 23, wherein the polysilicon layer, the gate metal layer, and the gate hard mask layer are formed on the substrate of the peripheral region and the substrate of the cell region, and the method further comprising:
after the step of forming the gate hard mask layer, the gate metal layer, and the polysilicon layer in the substrate,
etching and removing the polysilicon layer of the cell region; and
etching and removing the polysilicon layer located at a boundary between the cell region and the peripheral region.

26. The method according to claim 25, further comprising:
depositing a nitride layer over the cell region and at the boundary between the cell region and the peripheral region where the polysilicon layer is removed.

27. The method according to claim 26, wherein the step of burying the gate in the substrate of the cell region is performed after the step of depositing the nitride layer.

28. The method according to claim 23, wherein the forming of the gate hard mask layer includes any one of (i), (ii), (iii) and (iv), wherein:
(i) depositing a nitride layer on the gate metal layer and Chemical Mechanical Polishing (CMP) the nitride layer;
(ii) sequentially forming a nitride layer and an amorphous carbon layer on the gate metal layer;
(iii) sequentially depositing a nitride layer and an oxide layer and performing CMPing on the nitride and oxide layers;
(iv) sequentially depositing a nitride layer and an oxide layer on the gate metal layer and performing CMP-processing on the nitride layer and the oxide layer, and then wet-etching the resultant nitride layer.

29. A semiconductor device having a cell region and a peripheral region, the semiconductor device comprising:
a substrate formed in the cell region and the peripheral region;
a buried gate structure formed on the substrate in the cell region and comprising a trench extending from an upper surface of the buried gate structure, the trench being filled and having at least a buried gate formed therein, wherein the buried gate structure further comprises: a landing plug layer formed on the substrate in the cell region; and
a gate structure formed on the substrate in the peripheral region;
wherein a step height is formed between the upper surface of the buried gate structure and the surface of the substrate on which the gate structure is formed,
after the landing plug layer formed on the substrate in the cell region, the trench extending from the upper surface of the landing plug layer to within the substrate; and
a capping insulation layer filling the trench.

30. The semiconductor device according to claim 29, wherein the buried gate structure further comprises:
a hard mask layer formed on the substrate in the cell region;
the trench extending from the upper surface of the hard mask pattern to within the substrate; and
a capping insulation layer filling the trench.

31. The semiconductor device according to claim 29, where an upper surface of the substrate formed in the peripheral region is formed at a position lower than an upper surface of the substrate formed in the cell region.

* * * * *